INVENTOR
HAROLD D. KAISER

BY [signature]
ATTORNEY

Oct. 18, 1966 H. D. KAISER 3,279,947
HIGH CAPACITANCE DEVICE
Filed May 27, 1964
2 Sheets-Sheet 2
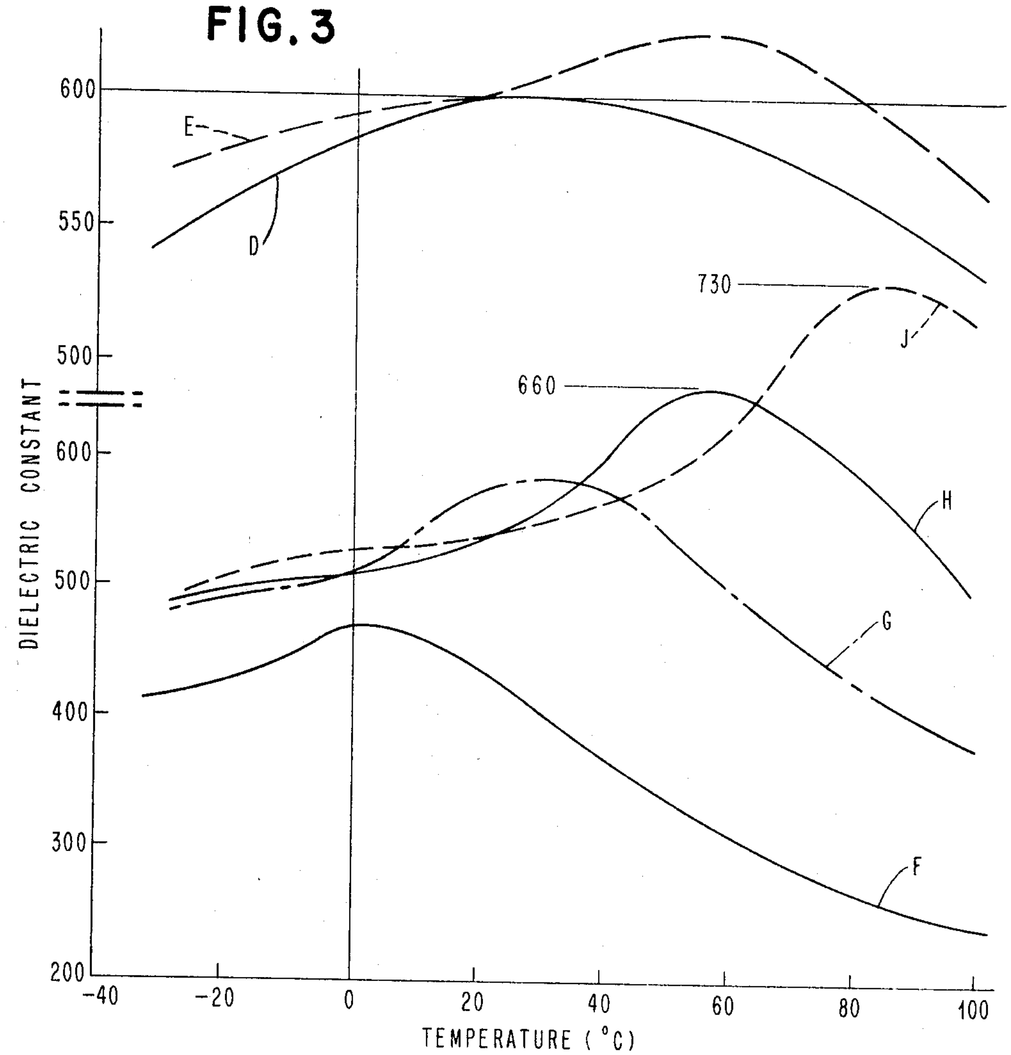
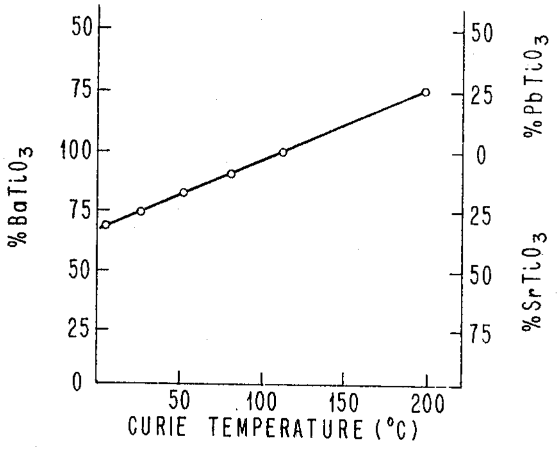
FIG. 4

United States Patent Office 3,279,947

Patented Oct. 18, 1966

3,279,947

HIGH CAPACITANCE DEVICE

Harold D. Kaiser, Poughkeepsie, N.Y., assignor to International Business Machines Corporation, New York, N.Y., a corporation of New York Filed May 27, 1964, Ser. No. 370,586

2 Claims. (Cl. 117—217)

This invention relates to an improved capacitance device as well as a method for making such a device and more particularly to an improved capacitance device employing a ferroelectric type composition the dielectric constant of which is relatively independent of its operating temperature.

In the development of microelectronic circuitry such as might be employed in digital computers and other electronic devices, a desired size reduction of the various electronic components is often limited by the electrical values and characteristics required of the respective components according to the particular circuit designs. In this sense, improved circuit design often is achieved only as a result of improvements in the components used in that circuit. In the case of capacitors, reduction in the dimensions of a capacitor is normally achieved by the employment of dielectric materials having increased dielectric constants.

A particular class of materials that has been investigated in recent years for employment as a dielectric material for microelectronic capacitors is the class of ferroelectric materials. Such materials have relatively high dielectric constants particularly in the neighborhood of their ferroelectric Curie temperature. However, the dielectric constant of such a material is highly temperature dependent and normally decreases rapidly as the temperature is varied away from the Curie temperature. It will be appreciated that temperature independent components are desirable in electronic circuits. Otherwise, such circuits must be provided with a controlled atmosphere to insure consistent operation. This latter alternative places extreme burden upon the design of electronic equipment and particularly digital computers where the trend is towards the minimization of the equipment size.

Ferroelectric materials may be described generally as a dielectric material the crystal structure of which has an absence of a center of symmetry and which material is characterized by a hysteresis effect when the material is placed in an alternating electric field. The ferroelectric Curie temperature of the material is that temperature at which the material undergoes a transition and loses its ferroelectric characteristic as the temperature is increased thereabove. A particular group of ferroelectric materials that have been extensively employed as dielectric materials is the group of the so-called perovskites. This group is charactrized by the general chemical formula $ABO_3$, A being di- or monovalent metal and B being a tetra- or pentavalent metal. Of this group of ferroelectrics, the most widely employed material is barium titanate ($BaTiO_3$) which has three transition temperatures which are respectively 120° C., 5° C. and −80° C. The highest of these transition temperatures is the so-called ferroelectric Curie temperature above which barium titanate is non-ferroelectric and is characterized by a cubic crystal structure. In the temperature range between 5° C. and 120° C., the crystal structure is tetragonal, the crystal structure being orthohombic in the temperature range between −80° C. and 5° C. and below −80° C. the crystal structure is rhombohedral. In the neighborhood of each of the transition temperatures, the dielectric constant of barium titanate is increased and ranges from 4,000 at the lowest transition temperature to 10,000 at the Curie temperature for single crystals. However, between the respective transition temperatures, the dielectric constant drops considerably.

It is not desirable to operate a microelectronic circuit in the neighborhood of 5° C. or 120° C. or to provide systems to maintain components and circuitry at these respective temperatures.

It is generally well known that the transition temperatures, and in particular the Curie temperature of barium titanate, can be lowered by the addition of other materials to the crystal lattice. For example, the addition of strontium titanate ($SrTiO_3$) can have the effect of lowering the Curie temperature to as much as 0° C. for an addition of approximately 33 percent strontium titanate. In this manner, particular compositions can be obtained which have a Curie temperature and thus a high dielectric constant at or near room temperature. However, because of the very nature of the ferroelectric material in the neighborhood of its Curie temperature, the dielectric constant is still highly temperature dependent and components employing such a composition still must be operated in a controlled temperature atmosphere.

It is then an object of the present invention to provide a unique and improved composition having a high dielectric constant that is relatively temperature independent.

It is another object of the present invention to provide a capacitance device for microelectronic circuitry employing a unique dielectric material such as to provide high capacitance that is relatively temperature independent.

It is still another object of the present invention to provide an improved method for the fabrication of a unique dielectric material having a high dielectric constant that is relatively temperature independent.

As stated above, the addition of strontium titanate to the barium titanate serves to lower the Curie temperature of the combination to a degree depending upon the amount of strontium titanate that is added thereto. It is also known to those skilled in the art that the addition of either lead titanate ($PbTiO_3$) or lead zirconate ($PbZrO_3$) can serve to increase the Curie temperature of the barium titanate composition. In any event, a sintered mixture of the respective combinations of materials is characterized by a particular Curie temperature as though the combination were a single homogeneous composition with the result that the dielectric constant or permittivity is still highly temperature dependent, particularly in the neighborhood of the Curie temperature.

To achieve the objects of the present invention, it has been discovered that a composition having a relatively temperature independent permittivity or dielectric constant and more particularly having a dielectric constant the temperature dependence of which can be controlled, can be obtained from a mixture of two or more ferroelectric materials in powdered or granular form which are kept separate from one another during the fabrication process such that the resultant composition is a mixture of such discrete granular particles separated from one another as, for example, by an appropriate binder material. Such a composition is not characterized by a single Curie temperature at which the dielectric constant is at an optimum but rather it is characterized by a dielectric constant that can be described as being approximately proportional to the weighted product of the dielectric constants of the individual material particles. Thus, if it is required to increase the dielectric constant of the composition for a particular operating temperature range, one can fulfill this requirement by adding an appropriate amount of a ferroelectric material having an optimum dielectric constant in that temperature range.

While the present invention may employ any two or more ferroelectric materials having different Curie temperatures, particular preferred compositions include sintered mixtures of barium titanate and strontium titanate of various percentages when it is desired to enhance the dielectric constant in the neighborhood of room temperature and sintered mixtures of barium titanate and a composition selected from the group of lead titanate and lead zirconate when it is desired to enhance the dielectric constant at temperatures well above room temperature. Corresponding carbonates and oxides may also be readily employed. In each case, the respective powdered materials are mixed with a glass binder which serves to keep the respective powdered particles separate from one another and will not be evaporated during the firing step of the fabrication process.

A feature, then, by which the objects of the present invention are achieved, resides in a dielectric composition of two or more powdered ferroelectric materials having different Curie temperatures which ferroelectric materials are suspended in and dispersed throughout a glassy binder material.

Specifically, a feature of the present invention resides in a dielectric material including a plurality of powdered sintered mixtures of barium titanate and a material selected from the group of strontium titanate, lead titanate and lead zirconate, which powdered particles are suspended in a glass binder.

Even more specifically, a feature of the present invention resides in a dielectric composition of a plurality of barium-strontium titanates having different Curie temperatures which materials are suspended in a glassy binder material.

Other objects, advantages and features of the present invention will become readily apparent from a review of the following specification when taken in conjunction with the drawings wherein:

FIGURE 3 is a graph of the dielectric constant versus temperature for a plurality of barium-strontium titanates having different percentages of barium titanate and strontium titanate; and FIGURE 4 is a plot of temperature of maximum permittivity for a barium titanate system having different percentages of strontium titanate and lead titanate.

Figure 1:
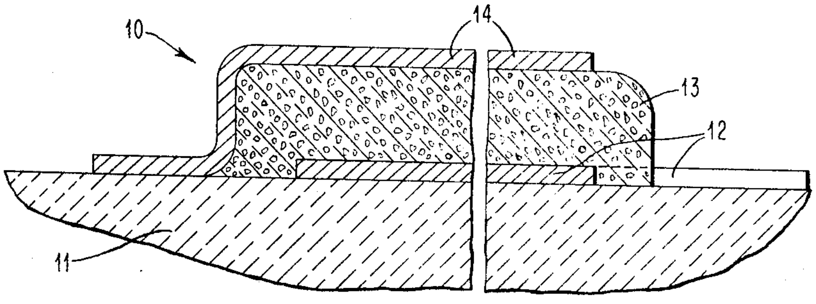
FIGURE 1 is a cross section of a capacitance device employing a dielectric material of the present invention.

Referring briefly to FIGURE 1 there is shown therein a thin film capacitor device of a type that might be adapted for employment in microelectronic circuitry. Capacitor 10 may be fabricated by a conventional silk screening technique by which first electrode 12 is deposited on ceramic module 11 and then fired at an appropriate temperature. Dielectric material 13, the composition of which is more fully described below is then deposited on electrode 12 according to a process that also is more clearly described below after which second electrode 14 is deposited thereon by a conventional silk screening technique. If it is so desired, a plurality of film electrodes and dielectrics may be sandwiched together. The dimension of the respective electrodes and dielectrics as employed in such a microelectronic capacitance could be of the order of 0.020 inch in a side and a thickness of the dielectric would be of the order of 0.5–0.7 mil.

Figure 2:
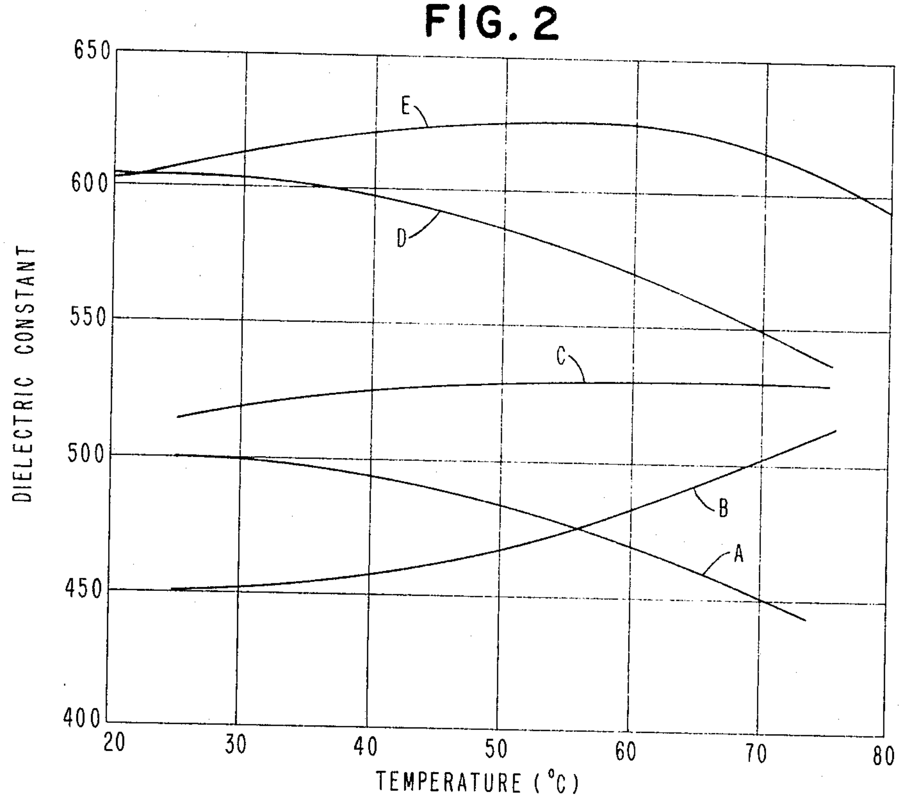
FIGURE 2 is a series of curves representing the dielectric constant or permittivity versus temperature for various combinations of materials in accordance with the present invention.

To illustrate the results achieved by the present invention, reference is now made to FIGURE 2 which includes a series of curves representing plots of the dielectric constant versus operating temperature for two particular ferroelectric materials and to a dielectric composition formed of these materials according to the present invention. In FIGURE 2, Curve A represents a plot of permittivity versus operating temperature for a mixture of sintered particles containing 75 percent barium titanate and 25 percent strontium titanate, which particles are mixed with a glassy binder in the ratio of 75 percent of powdered particles to 25 percent of the binder material by weight or 82 percent of the powdered particles to 18 percent of the binder material by volume where the binder material is bismuth trioxide ($Bi_2O_3$). Curve B represents permittivity as a function of operating temperature for the same percentage of powdered particles suspended in the same amount of the glass binder material but where the sintered particles are 85 percent barium titanate and 15 percent strontium titanate. As will be more thoroughly described below, the composition characterized by Curve A has an optimum dielectric constant at its Curie point which is approximately 30° C. while the composition characterized by Curve B has its optimum dielectric constant at a Curie point which is approximately 75° C. Curve C is a plot of permittivity versus operating temperature for a dielectric composition formed of equal parts of the respective materials characterized by Curves A and B. It will be observed that Curve C is quite independent of temperature above 45° C. although the permittivity starts to fall off as the temperature is decreased below this point. This drop in permittivity below 45° C. can be easily corrected by increasing the percentage of the material characterized by Curve A.

It will be noted that the values of the dielectric constant as illustrated in FIGURE 2 are relatively low when compared to the optimum dielectric constants of any of the respective ferroelectric materials employed. This is primarily due to the large amount of the glass binder material employed. When the percentage of the binder material is decreased, it has been found that the permittivity increases as will be more fully described below.

Since it is the purpose of the glass binder to coat each of the respective dielectric particles to isolate them from one another as well as to fill in voids and reduce porosity, it will be understood that it is the volume percentage of the glass binder material, rather than percentage by weight, that is of importance. Thus, while the percentages of the respective ferroelectric materials are stated herein by weight, the respective percentages of the glass binder material are by volume unless otherwise specifically indicated.

To further illustrate the effects of the percentage of the binder material upon the composite dielectric and also to further illustrate the variation of the Curie temperature for barium-strontium titanate systems for different percentages of barium titanate and strontium titanate, reference is now made to FIGURE 3 which includes a series of curves of permittivity versus operating temperature for four different barium-strontium titanate systems. In FIGURE 3, it will be observed that a barium-strontium titanate system having 67 percent barium titanate will have a maximum permittivity at a Curie temperature of approximately 4° C. as characterized by Curve F in FIGURE 3. Curve G is representative of such a system containing 74 percent barium titanate and it will be observed that this system has maximum permittivity at a Curie temperature of approximately 30° C. Curve H represents such a system containing 81 percent barium titanate and it will be observed that this system has a maximum permittivity at a Curie temperature of approximately 55° C. while Curve J represents such a system containing 88 percent barium titanate and having a maximum permittivity at a Curie temperature of approximately 82° C.

In the case of each of Curves F, G, H and J the material is a sintered mixture of the respective different percentages of barium titanate and strontium titanate and in each case the barium-strontium titanate system constitutes 85 percent of the composition, the remaining 15 percent by volume being an appropriate glass binder. The effect of reducing the percentage of glass binder from 18 to 15 percent may be seen by comparisons of FIGURE 3 to FIGURE 2.

The composition characterized by Curve A of FIGURE 2 most closely resembles the similar composition characterized by Curve G of FIGURE 3, the principal difference being that the Curve A of FIGURE 2 contains 18 percent of binding glass material while the Curve G of FIGURE 3 contains 15 percent of the binding glass material. It will be observed that the material characterized by Curve A of FIGURE 2 has a maximum permittivity or dielectric constant of approximately 500 while the material characterized by Curve G of FIGURE 3 has a maximum permittivity or dielectric constant of approximately 590. In a similar manner, the composition characterized by Curve B of FIGURE 2 appears to have a maximum permittivity between 510 and 525 while a corresponding curve in FIGURE 3 would reside somewhere between Curves H and J of FIGURE 3 and would appear to have a maximum permittivity of approximately 650–700. Thus, it is seen that by reducing the amount of the glass binder from 18 to 15 percent, there is achieved an increase of the maximum permittivity or dielectric constant of approximately 20 percent.

Curve D of FIGURES 2 and 3 represents a plot of permittivity or dielectric constant versus operating temperature for a dielectric material of the present invention which in this particular case is a composite mixture of equal portions of the different barium-strontium titanate systems represented by Curves F, G, H and J of FIGURE 3, which respective systems have been ground into powdered particles as will be more fully described below and dispersed throughout a glass binder material, which binder material constitutes approximately 15 percent of the dielectric material by volume. Again it will be observed that, in the neighborhood of room temperature, i.e. 10° C. to 40° C., the permittivity is relatively temperature independent and is increased over the permittivity of the composite material of Curve C by roughly 20 percent. As distinct from Curve C it will be observed in regard to Curve D that the permittivity of the composite material characterized thereby starts to decrease below 20° C. and also above 40° C. In this latter situation, the permittivity can be increased by increasing the proportion of the barium-strontium titanate systems represented by Curves H and J.

Curve E of FIGURES 2 and 3 represents the permittivity versus operating temperature of a composite mixture of the same respective barium-strontium titanate systems represented by Curves F, G, H and J of FIGURE 3 in the ratio of three parts of each of the systems represented by Curves H and J (i.e. 81 percent barium titanate and 88 percent barium titanate respectively) to one part of each of the systems represented by Curves F and G (i.e. 67 percent barium titanate and 74 percent barium titanate respectively) which composite mixture also includes 15 percent by volume of glassy binder material. It is observed that permittivity of the composition represented by Curve E is significantly increased particularly in the temperature range above 40° C. In the case of Curve E, the percentage of the higher Curie temperature titanates has been significantly increased to emphasize the effect that can be achieved thereby and it will be appreciated that appropriate choice of the different percentages of the respective titanate systems can result in a specifically temperature independent permittivity similar to that represented by Curve C in FIGURE 2 above 45°.

While a decrease in the percentage of the glass binding material results in an overall increase of the dielectric constant or permittivity of the composite mixture, it has been observed that the function of the binding material is diminished if the percentage of the binding material is reduced below 15 percent of the composite dielectric material by volume. That is to say, the purpose of the binding material is to isolate the respective powdered ferroelectric material particles from one another and if the percentage of the binding material is reduced below 15 percent, a sintering together of some of the different ferroelectric particles begins to occur and the composite mixture begins to take on the characteristics of a single composition characterized by a particular single Curie temperature.

In order to better describe the dielectric compositions of the present invention, the method of fabricating such compositions will now be explained. According to the present invention, each particular barium-strontium titanate system is first formed by appropriate grinding and firing to achieve the particular sintered mixture. The resultant systems thus obtained are then ground and mixed together in the particular percentages as required and also mixed with the appropriate amount of the glass binder material and also with appropriate squeegee medium as required for appropriate silk screening techniques as anticipated in the present invention. The resultant mixture is then silk screened on an appropriate base or electrode and fired to achieve the end result.

As a specific example, the method of the present invention will now be described in regard to particular compositions. Consider the composite dielectric material of the present invention formed of 85 percent by volume of two particular barium-strontium titanate powdered systems dispersed in 15 percent by volume of a glassy binder material. One particular ferroelectric system will include 75 percent barium titanate and 25 percent strontium titanate while the other system will include 85 percent barium titanate and 15 percent strontium titanate. Each particular system is formed by intimately mixing the appropriate amount of barium-strontium titanates which mixing may be accomplished by ball milling or other methods well known in the art. The mixture is then dried and calcined at 1000–1100° C. for two to three hours. The calcined material is then broken up and thoroughly remixed and then fired at approximately 1350° C. for a period of two to four hours to insure thorough sintering of the respective component ferroelectric materials.

After each of the two particular barium-strontium titanate systems have been formed in the above described manner, the respective systems are then ground together in appropriate proportions as required to achieve the particular desired end results. At this time, an appropriate glass binding material is also added in such an amount as to form 15 percent of the total composition by volume. The resultant mixture is then ground to the appropriate particle size by wet grinding in a mortar and pestle and then dispersed in an appropriate squeegee medium for later screening and firing in the ratio of 70 percent of the particular mixture to 30 percent of the squeegee medium.

A particular procedure for fabricating a capacitor utilizing the dielectric material of the present invention includes the screening and firing of the bottom electrode using standard procedures after which a layer of the dielectric material which was obtained as described in the previous paragraph is screened onto the bottom electrode. The combination is then dried at 150° C. for approximately 15 minutes after which a second layer of the dielectric material is screened onto the first layer and the combination is allowed to set for one-half hour and then further dried at 150° C. for approximately 15 minutes. The resultant combination is then placed on an alumina firing plate and fired at 1000° C. for approximately two hours after which it is removed from the furnace and quenched by placing on a large aluminum block. The top electrode material is then screened onto the dielectric material using standard techniques.

It will be appreciated that the above described procedure can be used for fabrication of any dielectric material including the combination of two or more barium-strontium titanate systems. It is believed that if other ferroelectric materials are desired to be employed in place of particular barium-strontium titanate systems, one skilled in the art will be able to make appropriate adjustment in the above described procedure to achieve this end.

The particular electrode materials employed are not particularly critical and may be platinum, gold, silver or any combination of noble metals, although a gold-platinum material is preferred.

The particular glass binding material may be formed of any electrical grade glass or glass forming oxide such as, for example, barium borosilicate, lead borosilicate having a low lead content, or bismuth trioxide. It is preferable that such an electrical grade glass have a softening point in the range of 800°–900° C.

While it is known that the addition of strontium titanate to barium titanate will form a composite body having a Curie point lower than that of pure barium titanate, other compositions having similar crystal structures may be added to barium titanate to achieve an increased Curie point when such is desired. Particular materials that may be used toward this end include lead titanate and lead zirconate. To show the effect of the addition of such a material to barium titanate in relation to the effect of adding strontium titanate to barium titanate, reference is now made to FIGURE 4 which is a plot of the temperature at which optimum permittivity or the dielectric constant is achieved (i.e. Curie temperature) for various percentages of strontium titanate and lead titanate being added to the barium titanate. It is observed in FIGURE 4 that an increase in the amount of strontium titanate added to the barium titanate lowers the Curie temperature in an approximately linear manner while the addition of lead titanate to the barium titanate increases the Curie temperature of the system in almost the same linear manner.

It should be emphasized that when one particular ferroelectric material is added to another to achieve a sintered composition having a specific Curie point, the two materials should have similar crystal lattice structures, which is the case of the various materials discussed above, and be members of the so called perovskite group. However, it will be appreciated that the present invention is directed toward the combination of any two or more ferroelectric materials in powdered form which powder is dispersed throughout a glass binder to separate the respective material particles from one another to achieve a dielectric composition characterized by the high dielectric constant or permittivity without having particular and undesirable characteristics of such ferroelectric materials such as a particular Curie temperature and a highly temperature dependent dielectric constant. In this sense, the present invention is directed towards the composition comprising any two or more ferroelectric material systems, each of which has a different Curie temperature, and in this sense it is not required that the two particular ferroelectric material systems should have the same or similar crystal lattice structures.

While the present invention has been particularly shown and described with reference to preferred embodiments of the specific compositions, it will be understood by those skilled in the art that changes and modifications in form and details may be made, such as the employment of pressed pellet materials in place of the above described screened materials when capacitors of larger physical size are desired. It will be further understood that such changes do not depart from the spirit and scope of the present invention.

What is claimed:

1. The method of fabricating a high capacitance device on a substrate which comprise the steps of:
depositing a first electrode material on said substrate and forming a first capacitor electrode;
mixing barium titanate with a material selected from the group consisting of strontium titanate, lead titanate and lead zirconate in a first given ratio and sintering same together to form a first ferroelectric material;
mixing barium titanate with a material selected from the group consisting of strontium titanate, lead titanate and lead zirconate in a second given ratio different from said first given ratio and sintering same together to form a second ferroelectric material;
grinding said first ferroelectric material and said second ferroelectric material together in a given proportion;
adding glass binder material to said ferroelectric material mixture to form a resultant mixture thereof, said binder material constituting at least 15%, by volume, of said resultant mixture,
depositing said resultant mixture over said first capacitor electrode;
firing said resultant mixture above the melting point of said glass binder material but below the sintering temperature of said ferroelectric materials; and
depositing a second electrode material on said final resultant mixture and forming a second capacitor electrode.

2. The capacitance device produced by the method of claim 1.

References Cited by the Examiner

UNITED STATES PATENTS

| | | | |
|---|---|---|---|
| 2,956,219 | 10/1960 | Cianchi | 317—258 |
| 2,972,176 | 2/1961 | Gravley | 106—39 X |
| 3,000,745 | 9/1961 | Cianchi | 106—39 |
| 3,023,167 | 2/1962 | Dunne | 106—39 X |
| 3,103,441 | 9/1963 | Cline et al. | 106—39 |
| 3,103,607 | 9/1963 | Rulon | 317—258 X |
| 3,125,618 | 3/1964 | Levinson | 106—39 X |
| 3,195,030 | 7/1965 | Herczog et al. | 317—258 |

OTHER REFERENCES

Birks: Modern Dielectric Materials, Heywood and Company Ltd., London, 1960, pp. 186–187.

LARAMIE E. ASKIN, *Primary Examiner.*

JOHN F. BURNS, ROBERT K. SCHAEFER, *Examiners.*

D. J. BADER, *Assistant Examiner.*